(12) United States Patent
Ho et al.

(10) Patent No.: US 7,972,957 B2
(45) Date of Patent: Jul. 5, 2011

(54) METHOD OF MAKING OPENINGS IN A LAYER OF A SEMICONDUCTOR DEVICE

(75) Inventors: Bang-Chein Ho, Hsin-Chu (TW); Jen-Chieh Shih, Youngkang (TW); Jian-Hong Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 249 days.

(21) Appl. No.: 11/363,860

(22) Filed: Feb. 27, 2006

(65) Prior Publication Data
US 2007/0202690 A1 Aug. 30, 2007

(51) Int. Cl.
*H01L 21/44* (2006.01)
(52) U.S. Cl. ............... 438/638; 438/622; 438/637
(58) Field of Classification Search ........... 438/638, 438/637, 622
See application file for complete search history.

(56) References Cited

U.S. PATENT DOCUMENTS

| | | | |
|---|---|---|---|
| 5,783,342 A * | 7/1998 | Yamashita et al. | 430/30 |
| 5,877,076 A * | 3/1999 | Dai | 438/597 |
| 6,083,824 A | 7/2000 | Tsai et al. | |
| 6,204,168 B1 * | 3/2001 | Naik et al. | 438/638 |
| 6,376,155 B2 * | 4/2002 | Ito | 430/313 |
| 6,436,810 B1 * | 8/2002 | Kumar et al. | 438/633 |
| 6,500,773 B1 * | 12/2002 | Gaillard et al. | 438/790 |
| 6,720,252 B2 * | 4/2004 | Chen et al. | 438/636 |
| 6,875,688 B1 * | 4/2005 | America et al. | 438/638 |
| 6,898,851 B2 * | 5/2005 | Nishioka et al. | 29/852 |
| 7,226,806 B2 * | 6/2007 | Sakayori et al. | 438/106 |
| 7,365,025 B2 * | 4/2008 | Lee et al. | 438/763 |
| 2005/0037605 A1 | 2/2005 | Kim et al. | |
| 2006/0110941 A1 * | 5/2006 | Yen et al. | 438/781 |
| 2006/0281030 A1 * | 12/2006 | Lin et al. | 430/313 |

* cited by examiner

*Primary Examiner* — David Vu
*Assistant Examiner* — Brandon Fox
(74) *Attorney, Agent, or Firm* — Tung & Associates (57) ABSTRACT

A method of making a semiconductor device including forming a first sacrificial layer over a first layer to be etched, the first sacrificial layer having a plurality of openings formed therethrough exposing a portion of the first layer; forming a first photoresist layer over the first sacrificial layer and filling the plurality of openings formed through the first sacrificial layer; forming a plurality of openings in the first photoresist layer, each one of the plurality of openings in the first photoresist layer overlying one of the openings in the first sacrificial layer and wherein each opening in the first sacrificial layer has a smaller cross-sectional area then the cross-sectional area of the overlying opening in the first photoresist layer; and etching the first layer through the openings in the first photoresist layer and the first sacrificial layer, comprising exposing the first layer to an etching material.

15 Claims, 9 Drawing Sheets

METHOD OF MAKING OPENINGS IN A LAYER OF A SEMICONDUCTOR DEVICE

FIELD OF THE INVENTION

The present invention, relates to a method of making a semiconductor device, and more particularly, to a method of etching an opening in a layer of a semiconductor device.

BACKGROUND OF THE INVENTION

Nakao, U.S. Pat. No. 6,134,008, issued Oct. 17, 2000, discloses an aligner and patterning method using phase shift mask. Exposure light is split into first and second exposure light beams and first and second phase shift masks are irradiated with the first and second exposure light beams. In the first and second phase shift masks a plurality of light shielding portions and a plurality of strip-shaped transmission portions are located between the plurality of light shielding portions for alternatively inverting the phase of transmission exposure light. Transmitted in combined exposure light resulting from interference is directed onto a photoresist material. In the above-described configuration, the aligner uses a phase shift mask for forming a fine and dense contact hole pattern and a patterning method thereof.

Kemp, U.S. Pat. No. 5,308,741, issued May 3, 1994, discloses a lithographic method using double exposures, physical mask shifting, and light phase shifting to form masking features on a substrate masking layer. A first phase shift mask is placed in a first position adjacent the substrate. The substrate is covered by the masking layer. The masking layer is exposed to light, or an equivalent energy source, through the first mask to form a first plurality of unexposed regions of the masking layer. Either a second mask or the first mask is placed adjacent the substrate in a second position which is displaced from the first position in at least one direction. A second exposure is used to form a second plurality of unexposed regions of the masking layer. The first and second pluralities of unexposed regions have common unexposed regions which are used to form the masking features.

Ham, U.S. Pat. No. 5,573,634, issued Nov. 12, 1996, discloses a method of forming contact holes of a semiconductor device. The method includes forming an insulating film over a semiconductor substrate. Thereafter, a photoresist film is coated over the insulating film. The photoresist film is exposed to light using a first exposure mask having windows adapted to allow portions of the insulating film corresponding to a part of contact holes to be exposed to the light, the part of contact holes having contact holes arranged diagonally to each other. The photoresist film is secondarily exposed to the light using a second exposure mask having windows arranged diagonally to each other and not overlapping with those of the first exposure mask. The light exposed portions of the photoresist film are removed to form a photoresist film having a pattern for exposing portions of the insulating film respectively responding to the contact holes.

Shimizu, U.S. Pat. No. 5,432,044, issued Jul. 11, 1995, discloses a method of forming a pattern using a phase shifting mask. The method includes forming a pattern using a phase shift mask which comprises applying at least first and second exposures. At least one exposure is conducted using a phase shifting mask and at least the other exposure is conducted for compensating the amount of light at a phase shifting boundary of the phase shifting mask.

Nakao, U.S. Pat. No. 6,162,736, issued Dec. 19, 2000, discloses a process for fabricating a semiconductor integrated circuit utilizing an exposure method. The exposure method includes forming a plurality of interlayer conductive paths through a first resist pattern which in turn is formed by an exposure of a hole pattern mask. A plurality of conductive lines is formed, adjacent the layer of conductive paths, through a second resist pattern which in turn is formed by double exposure of a line pattern mask and the hole pattern mask. Each conductive line is positioned on at least one of the conductive paths.

Lin et al., U.S. Pat. No. 6,664,011, issued Dec. 16, 2003, discloses a method including hole printing by packing and unpacking using Alternating Phase-Shifting Mask. The method includes adding extra holes to a given pattern of contact holes on the surface of a first mask, thus densifying the pattern of holes on the first mask and therefore reducing the range of hole-diameter to hole separation ratio. The pattern of added holes is alternating in phase with the pattern of desired holes. The added holes are filled up using a second mask.

The present invention provides alternatives to the prior art.

SUMMARY OF THE INVENTION

One embodiment of the invention includes a method of making a semiconductor device including forming a first sacrificial layer over a first layer to be etched, the first sacrificial layer having a plurality of openings formed therethrough exposing a portion of the first layer; forming a first photoresist layer over the first sacrificial layer and filling the plurality of openings formed through the first sacrificial layer; forming a plurality of openings in the first photoresist layer, each one of the plurality of openings in the first photoresist layer overlying one of the openings in the first sacrificial layer and wherein each opening in the first sacrificial layer has a smaller cross-sectional area then the cross-sectional area of the overlying opening in the first photoresist layer; and etching the first layer through the openings in the first photoresist layer and the first sacrificial layer, comprising exposing the first layer to an etching material.

In one embodiment of the invention the first sacrificial layer has a greater resistance to etching by the etching material then the resistance of the first photoresist material to etching by the etching material.

In one embodiment of the invention the first sacrificial layer comprises a hard mask.

In one embodiment of the invention the first sacrificial layer comprises silicon nitride.

In one embodiment of the invention the first sacrificial layer comprises a photoresist material.

In one embodiment of the invention the first sacrificial layer comprises a photoresist material that has been treated to increase its resistance to etching by the etching material.

In one embodiment of the invention the first sacrificial layer comprises a photoresist material, and further comprising treating the photoresist material comprising exposing the photoresist material to at least one of infrared light, ultraviolet light, deep ultraviolet light, extra ultraviolet light and x-rays to increase the resistance of the photoresist material to etching by the etching material.

In one embodiment of the invention the first sacrificial layer comprises a photoresist material, and further comprising treating the photoresist material with a chemical to react with the photoresist material to increase the resistance of the photoresist material to etching by the etching material.

In one embodiment of the invention the first sacrificial layer comprises a photoresist material, and further comprising treating the photoresist material by exposing the photoresist material to water vapor and then to alkoxysilane gas.

Other embodiments of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1A:
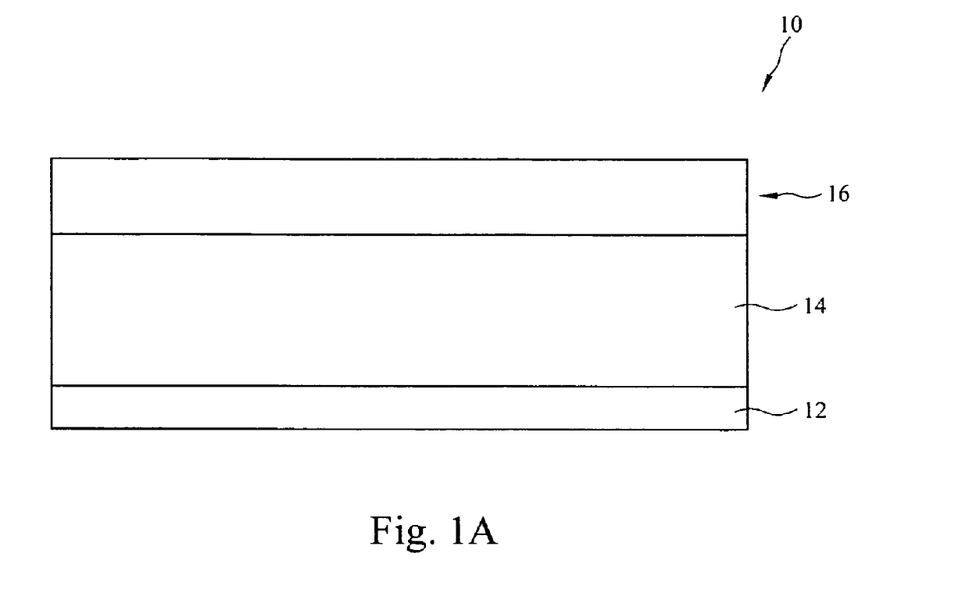
FIG. 1A illustrates one embodiment of the present invention including providing a first sacrificial layer over a first layer to be etched.

Referring now to FIGS. 1A-I, a method according to the present invention of making a semiconductor devices 10 includes providing a first layer 14 to be etched which may overlie a substrate 12 which may be a semiconductor wafer. The substrate 12 may be any material known to those skilled in the art for making semiconductor devices including, but not limited, to silicon, germanium, silicon and germanium, gallium arsenate, silicon carbide and silicon germanium. The first layer 14 to be etched may be an electrically conductive material or a dielectric. In one embodiment of the invention the first layer 14 to be etched is a dielectric such as silicon dioxide, or a low dielectric constant material such as SiOC, SiOF, SiC, SiCN. A first sacrificial layer 16 is provided over the first layer 14 to be etched as shown in FIG. 1A.

Figure 1B:
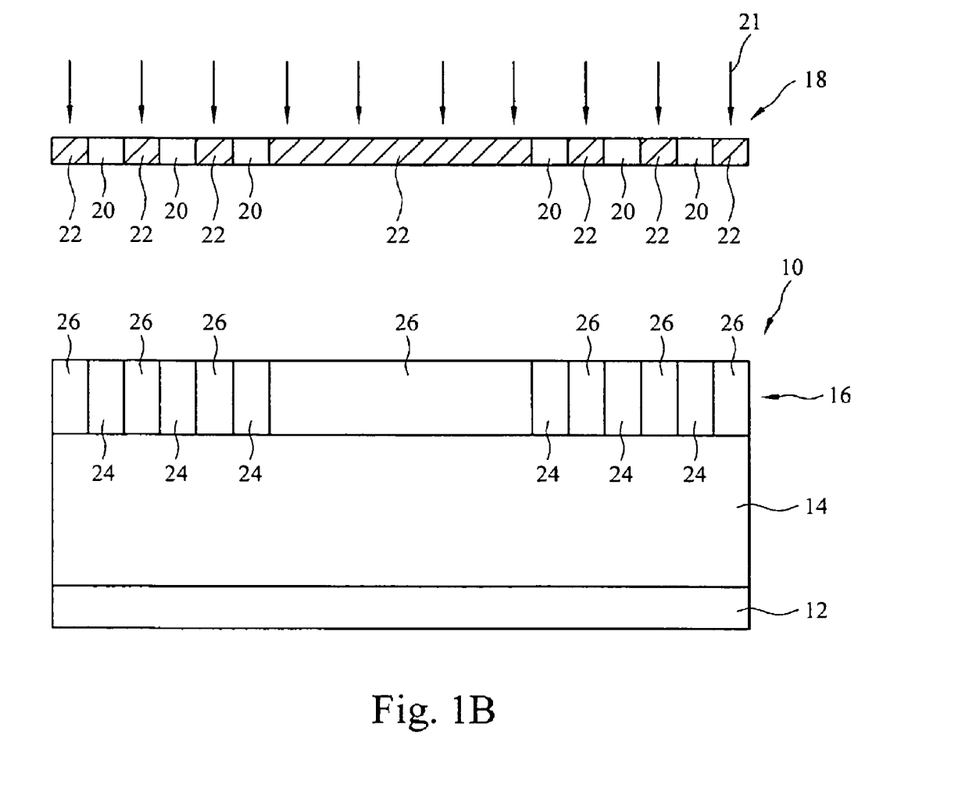
FIG. 1B illustrates one embodiment of the present invention including selectively exposing portions of the first sacrificial layer.

Referring now to FIG. 1B, a first mask 18 is provided and includes transparent portions 20 for transmitting light therethrough and non-transparent portions 22 for blocking light. Light as indicated by the arrows labeled 21 is shown through the first mask 18 exposing portions of the first sacrificial layer 16. In one embodiment of the invention the first sacrificial layer 16 comprises a photoresist material and includes light exposed portions 24 and unexposed portions 26.

Figure 1C:
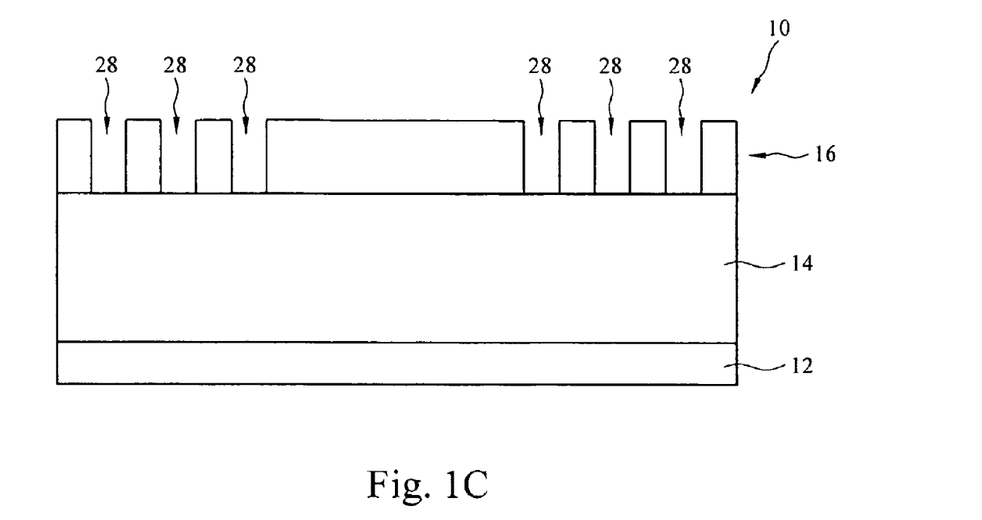
FIG. 1C illustrates one embodiment of the present invention including removing the exposed portion of the first sacrificial layer providing openings therein.

Referring now to FIG. 1C, in one embodiment the sacrificial layer 16 is developed and the exposed portions 24 removed leaving openings 28 extending through the first sacrificial layer 16.

Figure 1D:
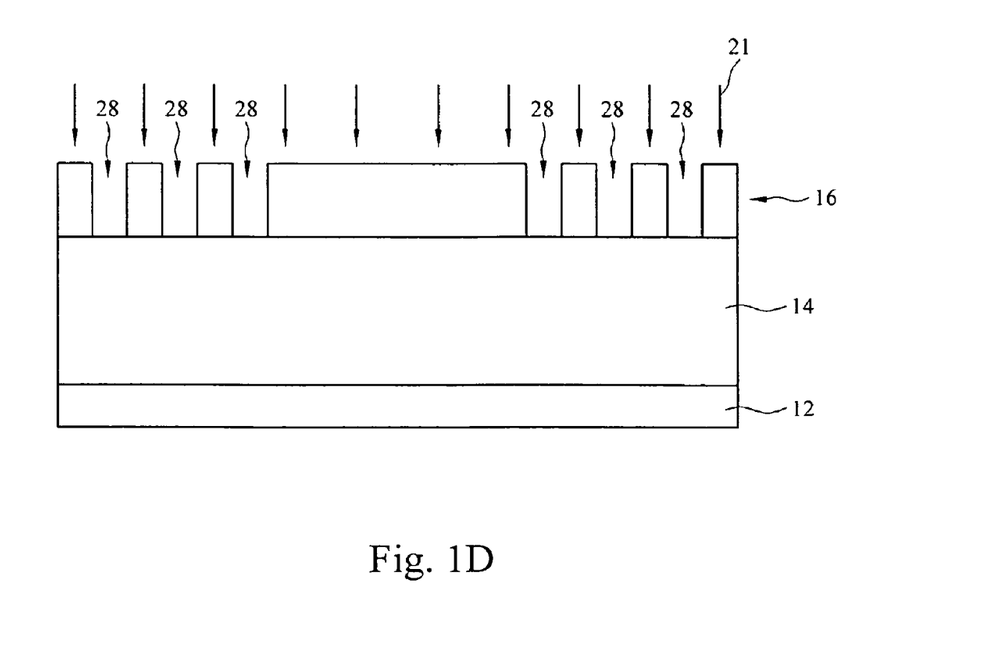
FIG. 1D illustrates one embodiment of the present invention including treating the first sacrificial layer.

Referring now to FIG. 1D, thereafter according to one embodiment of the invention the first sacrificial layer 16 is treated to increase the resistance of the first sacrificial layer 16 to etching by an etching material. In one embodiment of the invention the treating of the first sacrificial layer 16 may include at least one of irradiation of the first sacrificial layer 16 with infrared light, ultraviolet light, deep ultraviolet light (for example having a wave length ranging from 193-248 nm) extra ultraviolet light (for example having a wave length of 13.5 nm) and x-rays. In another embodiment of the invention the first sacrificial layer 16 is treated with a chemical to increase the resistance of the first sacrificial layer to etching by an etching material, such as, but not limited to, exposing the first sacrificial layer 16 to water vapor and then alkoxysilane gas.

Figure 1E:
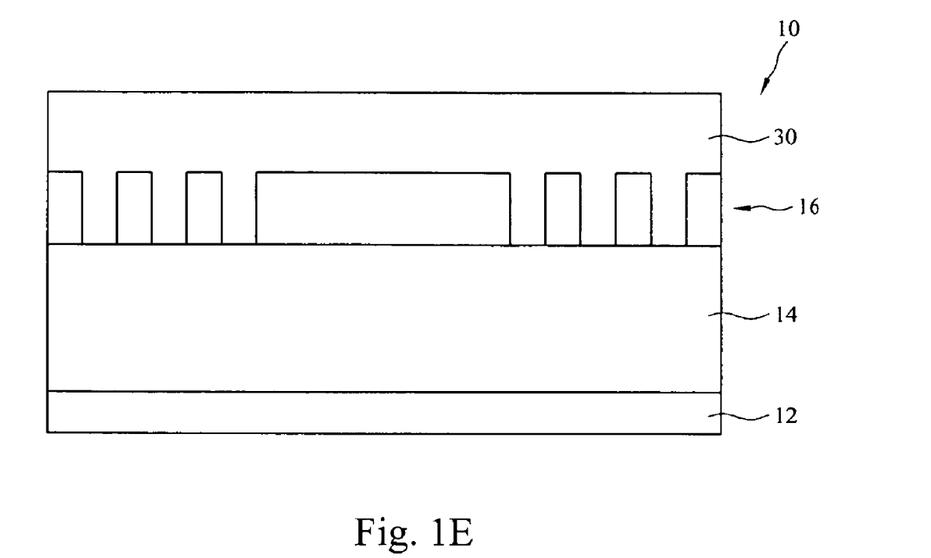
FIG. 1E illustrates one embodiment of the present invention including forming a first photoresist layer over the first sacrificial layer.

Referring now to FIG. 1E, thereafter, a first photoresist layer 30 is formed over the first sacrificial layer 16 and fills the openings 28 extending through the first sacrificial layer 16.

Figure 1F:
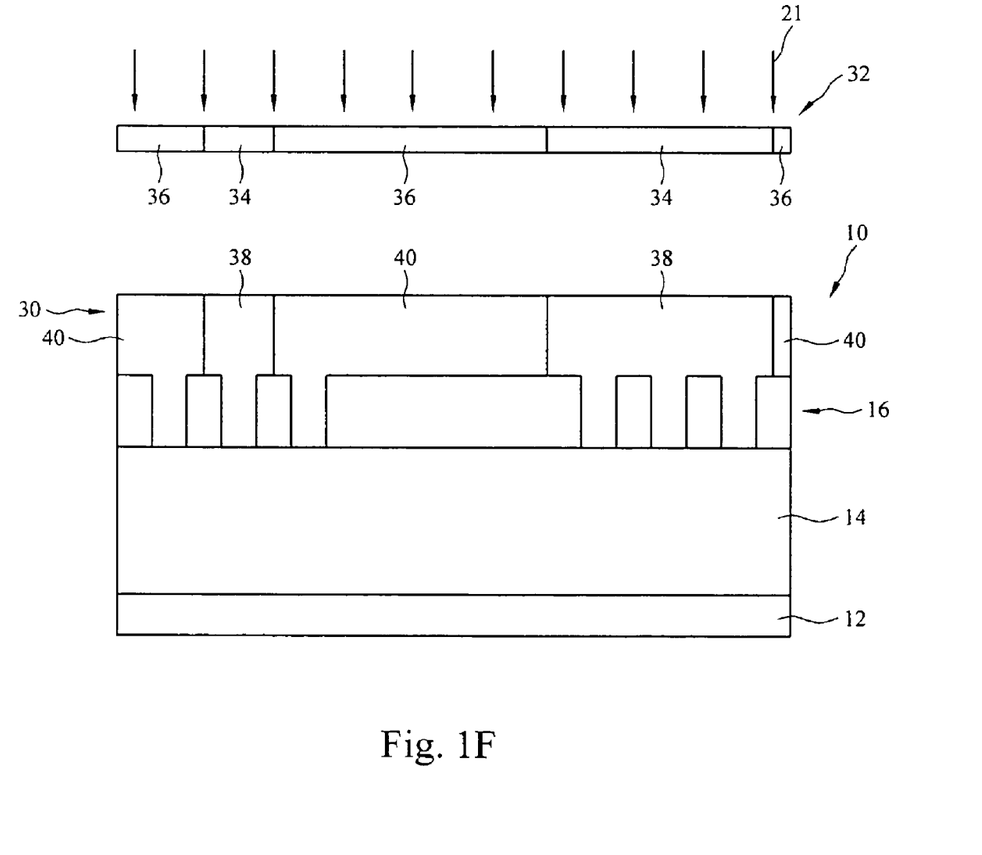
FIG. 1F illustrates one embodiment of the invention including exposing portions of the first photoresist layer.

Referring now to FIG. 1F, thereafter, a second mask 32 which includes transparent portions 34 for transmitting light therethrough and non-transparent portions 36 for blocking light is positioned over the structure of FIG. 1E and light is transmitted through the mask creating exposed portions 38 in the first photoresist and unexposed portions 40 in the first photoresist. As will be appreciated from FIG. 1F, the transparent portions 34 of the second mask 32 are larger than the transparent portions 20 of the first mask.

Figure 1G:
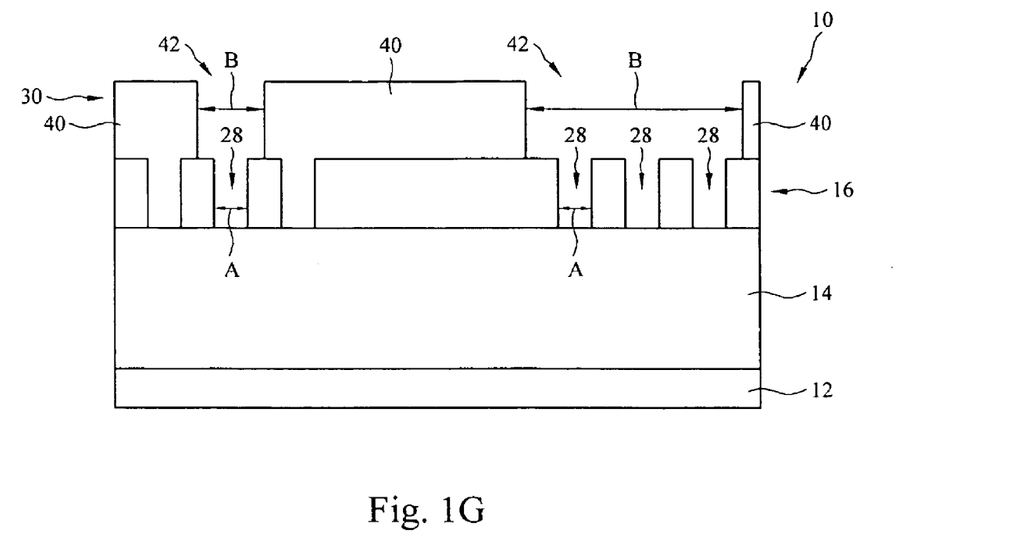
FIG. 1G illustrates one embodiment of the present invention including forming openings in the first photoresist layer that communicate with at least one opening in the first sacrificial layer.

Referring now to FIG. 1G, the first photoresist material is developed and the exposed portions removed to provide openings 42 in the first photoresist that communicate with at least one of the openings 28 and the sacrificial layer 16. If desired some of the openings 28 in the first sacrificial 16 may be blocked by unexposed portions 40 of the first photoresist layer 30. As will be appreciated by FIG. 1G, each opening 42 in the first photoresist layer 30 is vertically aligned with at least one opening 28 in the first sacrificial layer 16. In one embodiment, an opening 42 in the first photoresist layer 30 may span a plurality of adjacent openings 28 in the first sacrificial layer 16. Further, the width of the opening 42 in the first photoresist layer 30, generally indicated by arrow B, is greater in all directions than the width of the opening 28 in the first sacrificial layer 16 in all directions. Consequently, the cross-sectional area of the opening 42 in the first photoresist layer 30 is greater than the cross-sectional area of the opening 28 in the first sacrificial layer 16.

Figure 1H:
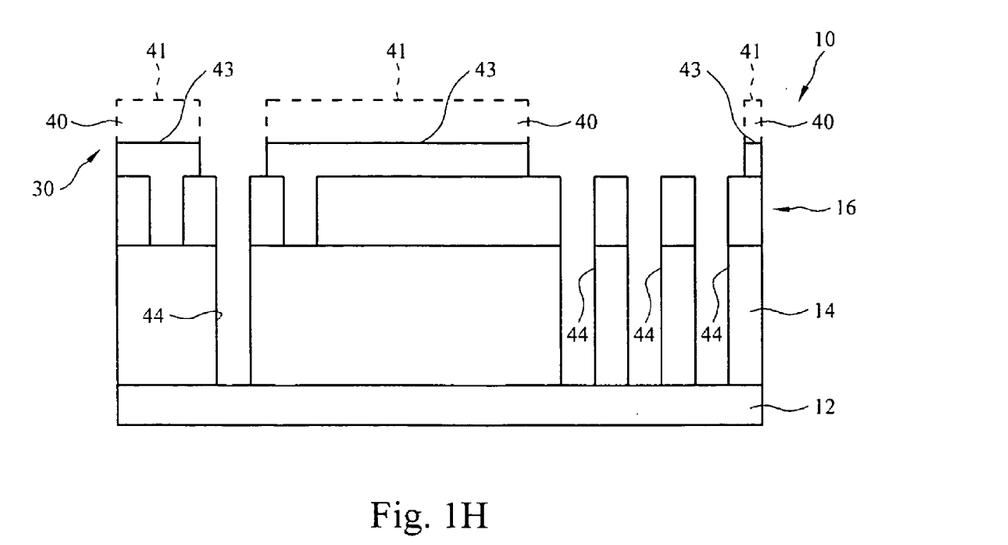
FIG. 1H illustrates one embodiment of the present invention including etching openings in the first layer.
Figure 1I:
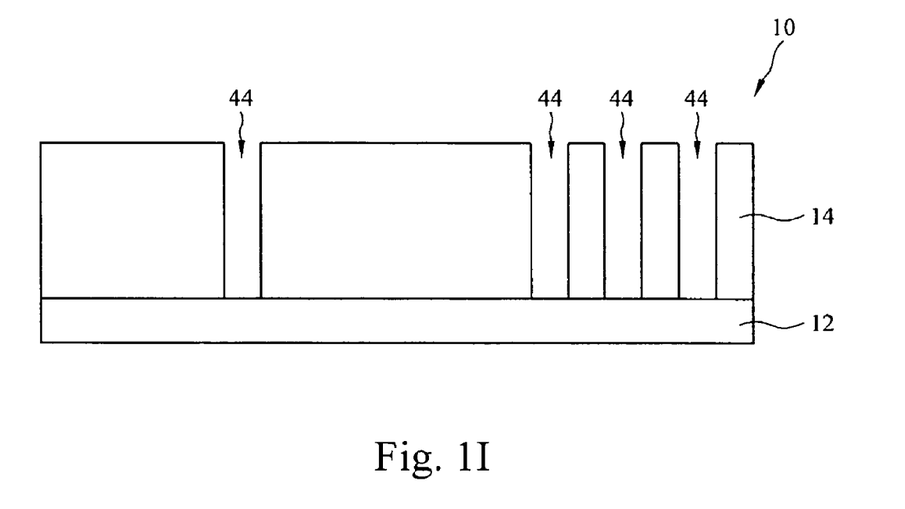
FIG. 1I illustrates one embodiment of the present invention including removing the first photoresist layer and the first sacrificial layer.

Referring now to FIG. 1H, thereafter, the semiconductor device is etched through the openings 42 and 28 to etch openings 44 through the first layer 14. In one embodiment of the invention, the first photoresist layer 30 is etched substantially by the etching material as will be appreciated by the position of the upper surface 41 of the photoresist layer 30 as originally deposited and the position of the upper surface 43 of the etched first photoresist layer 30. However, due to the treatment of the sacrificial layer 16, the sacrificial layer 16 remains substantially unaffected by the etching material. This allows for much narrower features and greater packing density of features in the first layer 14. In one embodiment the first layer 14 is silicon dioxide and the etching is accomplished using a plasma etch including $CF_4$ and $CHF_3$. The photoresist layer 30 and the sacrificial layer 16 may be exposed in the above embodiments using KrF light as exposure light as well as, G rays, I rays, EUV, and ArF light.

Referring now to FIGS. 2A-I, according to one embodiment of the invention a semiconductor device is manufactured including providing a first sacrificial layer 16 over a first layer 14 to be etched over a semiconductor substrate 12 as described with respect to FIG. 1A. However, on this embodiment, the first sacrificial layer 16 comprises a hard mask such as silicon nitride overlying the first layer 14. A second sacrificial layer 46 is provided over the first sacrificial layer 16. In one embodiment the second sacrificial layer 46 comprises a photoresist material.

Figure 2A:
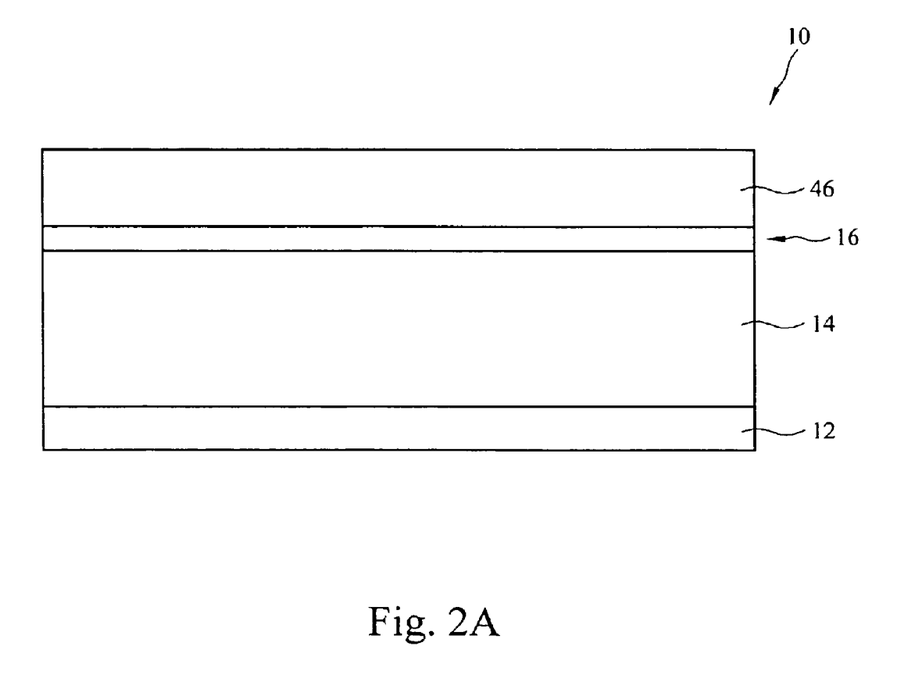
FIG. 2A illustrates one embodiment of the present invention including providing a first layer to be etched, a first sacrificial layer over the first layer, and a second sacrificial layer over the first sacrificial layer.
Figure 2B:
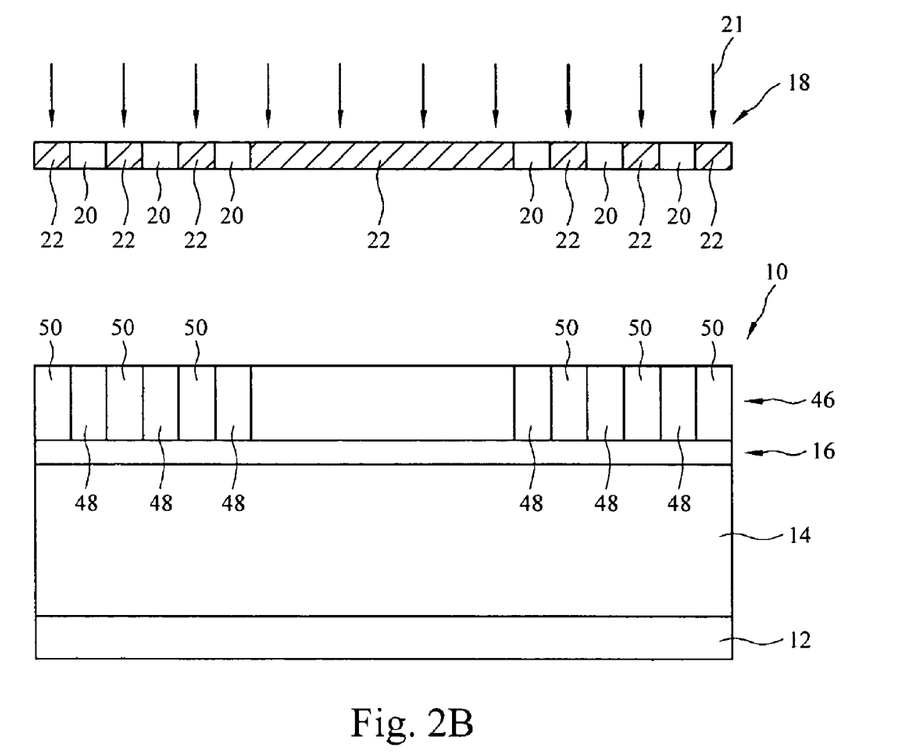
FIG. 2B illustrates one embodiment of the present invention including selectively exposing portions of the second sacrificial layer.
Figure 2C:
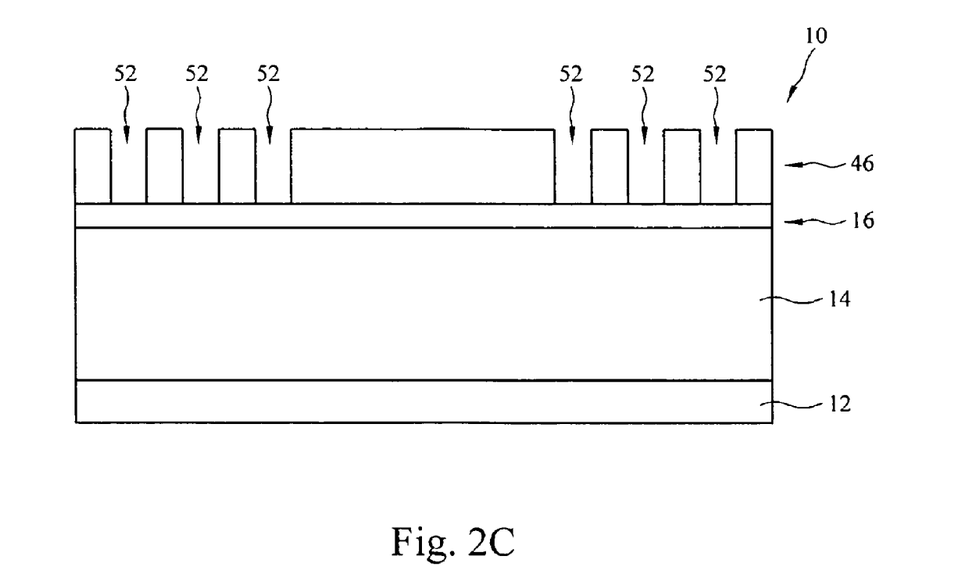
FIG. 2C illustrates one embodiment of the present invention including removing the exposed portion of the second sacrificial layer providing openings therein.

Referring now to FIG. 2B, a first mask 18 is provided which again includes transparent portions 20 transmitting light therethrough and non-transparent portions 22. Light is transmitted through the first mask 18 creating exposed portions 48 and unexposed portions 50 in the second sacrificial layer 46. Thereafter, the second sacrificial layer 46 is developed and the exposed portions 48 removed producing openings 52 through the second sacrificial layer 46. The openings 52 expose a portion of the first sacrificial layer 16.

Figure 2D:
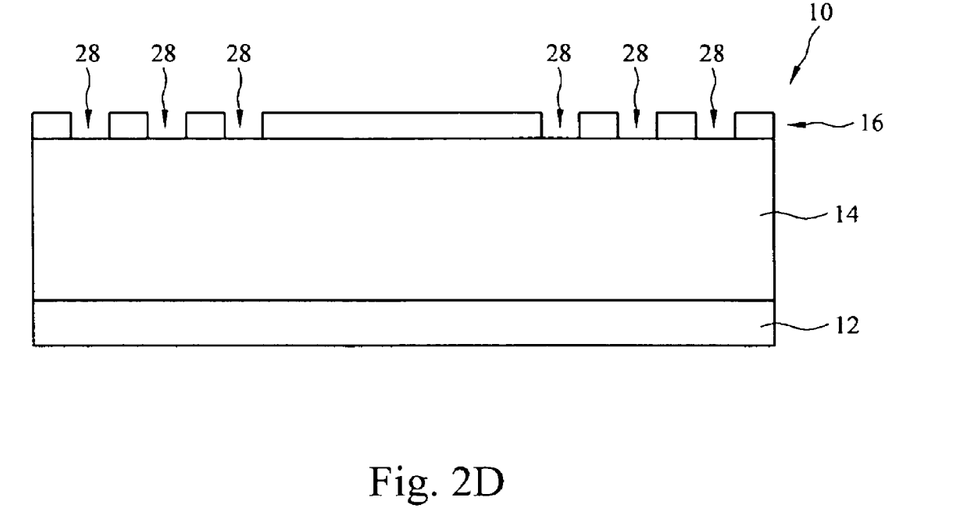
FIG. 2D illustrates one embodiment of the present invention including etching openings through the first sacrificial layer.

Referring now to FIG. 2D, the first sacrificial layer 16, which is a hard mask, is etched to provide openings 28 extending through the first sacrificial layer 16 exposing portions of the first layer 14. The silicon nitride may be etched with phosphoric acid in the case of a wet etch, or a plasma generated from $CF_4/O_2$. The second sacrificial layer 46 is removed.

Figure 2E:
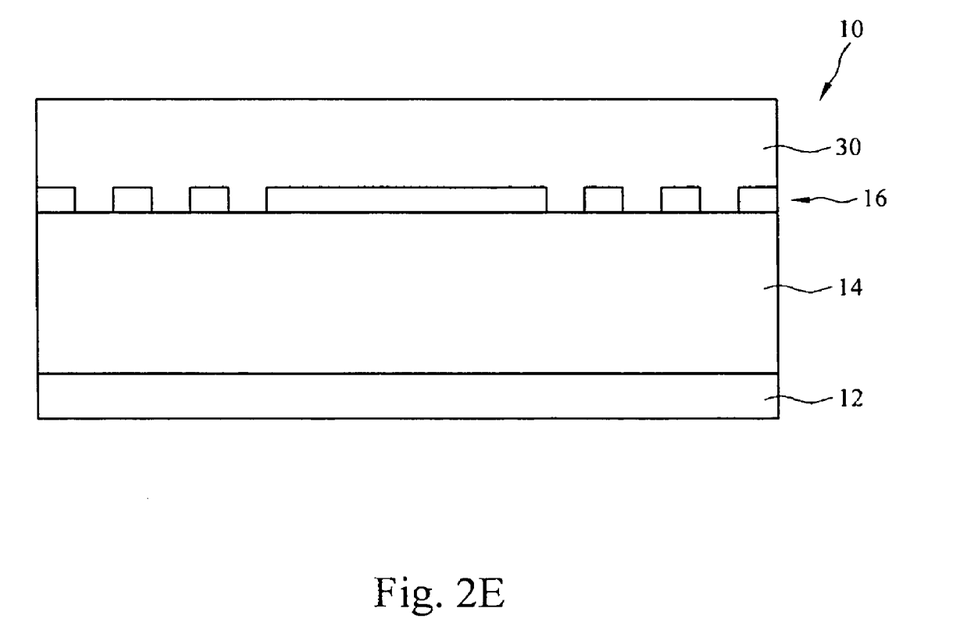
FIG. 2E illustrates one embodiment of the present invention including forming a first photoresist layer over the first sacrificial layer.

Referring now to FIG. 2E, a first photoresist layer 30 is formed over the first sacrificial layer 16 so that portions of the photoresist layer fill the openings 28 formed in the first sacrificial layer 16.

Figure 2F:
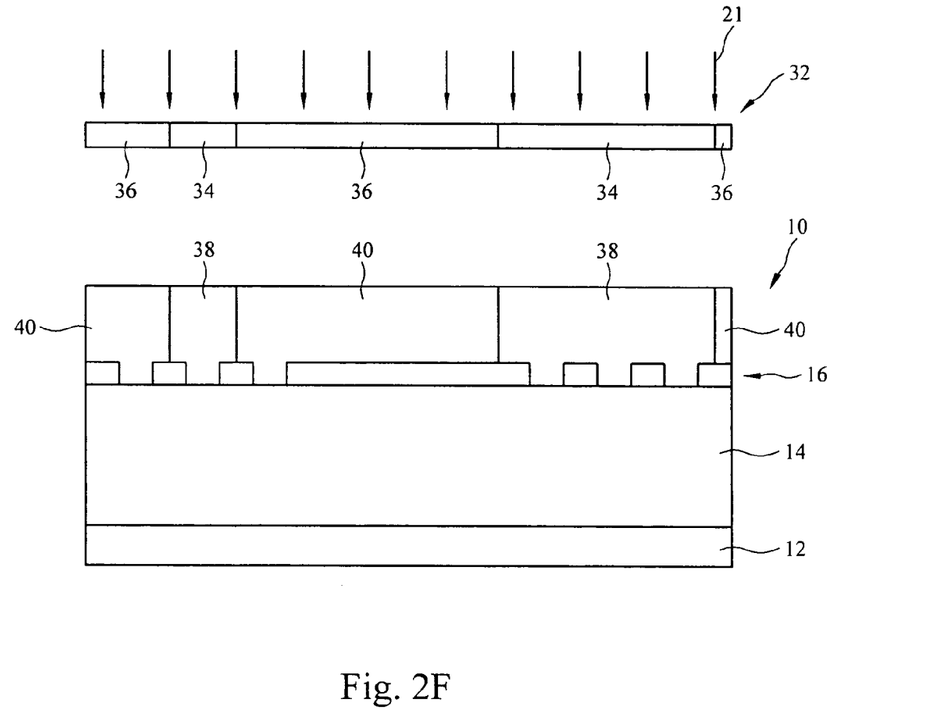
FIG. 2F illustrate one embodiment of the present invention including exposing portions of the first photoresist layer.

Referring now to FIG. 2F, thereafter a second mask 32 is provided including transparent portions 34 for transmitting light therethrough and non-transparent portions 36 for blocking light and light is transmitted through the second mask 32 creating exposed portions 38 in the first photoresist layer 30 and unexposed portions 40 in the first photoresist layer 30.

Figure 2G:
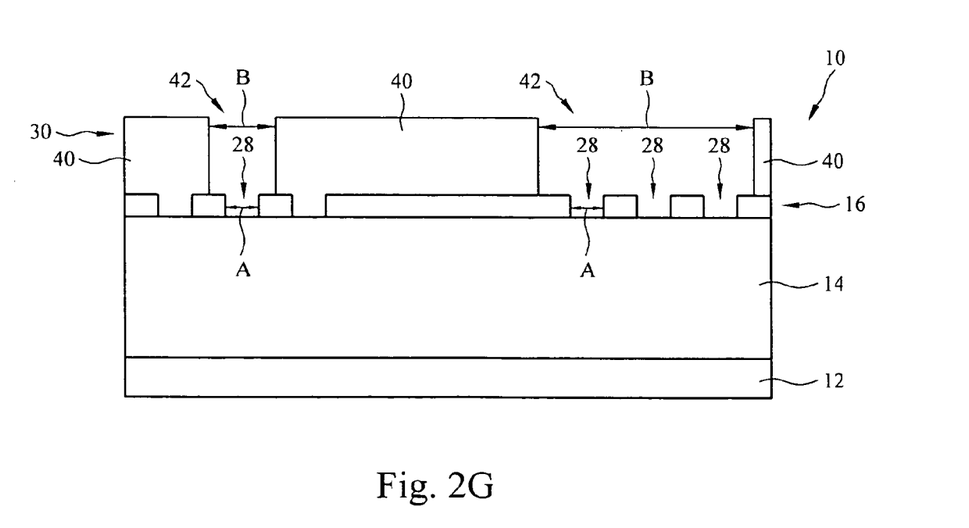
FIG. 2G illustrates one embodiment of the present invention including forming openings in the first photoresist layer that communicate with at least one opening in the first sacrificial layer.

Referring now to FIG. 2G, thereafter the photoresist layer 30 is developed and the exposed portions 38 removed leaving openings 42 in the first photoresist layer 30. In one embodiment, an opening 42 in the first photoresist layer 30 may span a plurality of adjacent openings 28 in the first sacrificial layer 16. Further, the width of the opening 42 in the first photoresist layer 30 generally indicated by arrow B is greater in all directions than the width of the opening 28 in the first sacrificial layer 16 in all directions. Consequently, the cross-sectional area of the opening 42 in the first photoresist layer 30 is greater than the cross-sectional area of the opening 28 in the first sacrificial layer 16.

Figure 2H:
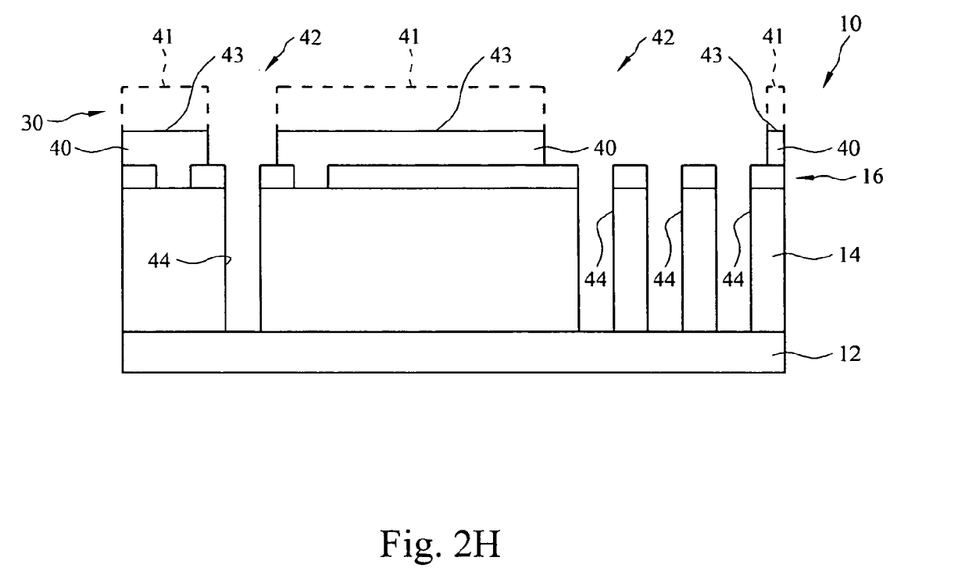
FIG. 2H illustrates one embodiment of the present invention including etching openings in the first layer.
Figure 2I:
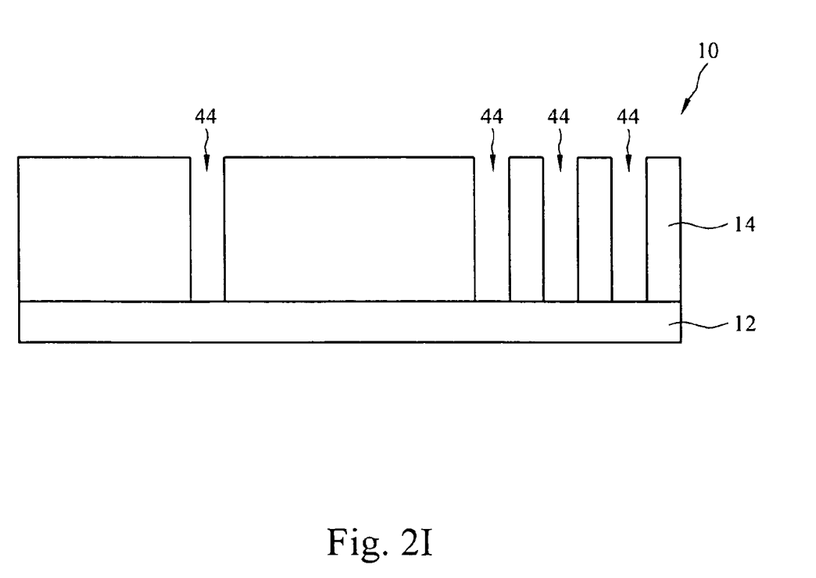
FIG. 2I illustrates one embodiment of the present invention including removing the first photoresist layer and the first sacrificial layer.

Referring now to FIG. 2H, thereafter the first layer 14 is etched to provide openings 44 therethrough. As will be appreciated from FIG. 2H, the first photoresist layer 30 is substantially etched as will be appreciated from the location of the upper surface 41 indicated by the dotted line of the first photoresist 30 as originally deposited and the upper surface 43 of the etched first photoresist layer 30. However, because the first sacrificial layer 16 is a hard mask such as silicon nitride, the first sacrificial layer 16 is substantially unaffected by the etching material. This allows for much narrower and more densely packed features to be formed in the first layer 14. Thereafter, the first photoresist layer 30 and the sacrificial layer 16 are removed as shown in FIG. 2I.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of making a semiconductor device comprising:
    forming a first sacrificial layer over a first layer to be etched, the first sacrificial layer having a plurality of openings formed therethrough, each opening exposing a top portion of the first layer to be etched at the bottom of each opening;
    forming a first photoresist layer over the first sacrificial layer and filling the plurality of openings formed through the first sacrificial layer;
    forming a plurality of openings in the first photoresist layer, each one of the plurality of openings in the first photoresist layer individually overlying at least one of the openings in the first sacrificial layer and wherein each opening in the first sacrificial layer has a smaller cross-sectional area than the cross-sectional area of the overlying opening in the first photoresist layer; and
    etching the first layer to be etched through the openings in the first photoresist layer and the first sacrificial layer, comprising exposing the first layer to be etched to an etching material;
    wherein the first sacrificial layer comprises a photoresist material that has been treated to increase the resistance of the photoresist material to etching by the etching material; and
    wherein the sizes of the openings in the first sacrificial layer remain substantially unaffected after etching of the first layer to be etched through the openings in the first photoresist layer and the first sacrificial layer.

2. A method as set forth in claim 1 wherein the first sacrificial layer comprises a hard mask.

3. A method as set forth in claim 1 wherein the first sacrificial layer comprises silicon nitride.

4. A method as set forth in claim 1 wherein the first sacrificial layer has been exposed to at least one of infrared light, ultraviolet light, deep ultraviolet light, extra ultraviolet light, and x-rays to increase the resistance of the photoresist material to etching by the etching material.

5. A method as set forth in claim 1 wherein the first sacrificial layer has been exposed to a chemical to increase the resistance of the photoresist material to etching by the etching material.

6. A method as set forth in claim 1 wherein the first sacrificial layer has been exposed to water vapor and then to alkoxysilane gas.

7. A method as set forth in claim 1 wherein the first layer comprises a dielectric.

8. A method as set forth in claim 1 wherein the first layer comprises silicon dioxide.

9. A method as set forth in claim 1 wherein the first layer comprises at least one of SiOC, SiOF, SiC and SiCN.

10. The method of claim 1, further comprising the step of removing the first sacrificial layer over the first layer.

11. A method of making a semiconductor device comprising:
forming a first sacrificial layer over a first layer to be etched, the first sacrificial layer comprising a photoresist layer having a plurality of openings formed therethrough, each opening exposing a top portion of the first layer to be etched at the bottom of each opening;
treating the first sacrificial layer to increase its resistance to etching by an etching material;
forming a first photoresist layer over the first sacrificial layer and providing openings in the first photoresist layer, and wherein each opening in the first photoresist layer is aligned with at least one opening in the first sacrificial layer, and wherein each opening in the first photoresist layer aligned with an opening in the first sacrificial layer has a greater cross-sectional area than the cross-sectional area of the opening in the first sacrificial layer;
etching the first layer to be etched through the openings in the first photoresist layer and the openings in the first sacrificial layer to provide a plurality of openings through the first layer to be etched; and
wherein the sizes of the openings in the first sacrificial layer remain substantially unaffected after etching of the first layer to be etched through the openings in the first photoresist layer and the first sacrificial layer.

12. A method as set forth in claim 11 wherein the first sacrificial layer comprises a photoresist material, and further comprising treating the photoresist material comprising exposing the photoresist material to at least one of infrared light, ultraviolet light, deep ultraviolet light, extra ultraviolet light, and x-rays to increase the resistance of the photoresist material to etching by the etching material.

13. A method as set forth in claim 11 wherein the first sacrificial layer comprises a photoresist material and further comprising treating the photoresist material comprising reacting the photoresist material with a chemical to increase the resistance of the photoresist material to etching by the etching material.

14. A method as set forth in claim 11 wherein the first sacrificial layer comprises a photoresist material, and further comprising treating the photoresist material comprising exposing the photoresist material to water vapor and then to alkoxysilane gas.

15. The method of claim 11, further comprising the step of removing the first sacrificial layer over the first layer.

* * * * *